(12) United States Patent
Babcock et al.

(10) Patent No.: US 7,808,034 B1
(45) Date of Patent: Oct. 5, 2010

(54) NON-VOLATILE MEMORY CELL WITH FULLY ISOLATED SUBSTRATE AS CHARGE STORAGE

(75) Inventors: Jeff Babcock, Sunnyvale, CA (US); Natasha Layrovskava, Sunnyvale, CA (US); Yuri Mirgorodski, San Jose, CA (US); Saurahh Desai, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/652,783

(22) Filed: Jan. 12, 2007

(51) Int. Cl.
*H01L 21/82* (2006.01)
(52) U.S. Cl. .............................. 257/319; 257/E21.662
(58) Field of Classification Search ........... 257/E21.564
See application file for complete search history.

(56) References Cited

U.S. PATENT DOCUMENTS

| 5,905,675 | A * | 5/1999 | Madurawe et al. ...... 365/185.18 |
| 6,031,771 | A * | 2/2000 | Yiu et al. ..................... 365/200 |
| 6,191,980 | B1 * | 2/2001 | Kelley et al. ........... 365/185.29 |
| 2002/0149084 | A1 * | 10/2002 | Tamaki et al. ................ 257/517 |
| 2005/0219912 | A1 * | 10/2005 | Gendrier et al. ........ 365/185.29 |

* cited by examiner

*Primary Examiner*—Sue A Purvis
*Assistant Examiner*—Benjamin P Sandvik
(74) *Attorney, Agent, or Firm*—Jurgen K. Vollrath; Vollrath & Associates

(57) ABSTRACT

In a non-volatile memory cell, charge is stored in a fully isolated substrate or floating bulk that forms a storage capacitor with a first poly strip and includes a second poly strip defining a control gate and a third poly strip coupled to a read transistor gate.

9 Claims, 4 Drawing Sheets

NON-VOLATILE MEMORY CELL WITH FULLY ISOLATED SUBSTRATE AS CHARGE STORAGE

FIELD OF THE INVENTION

The invention relates to a non-volatile memory (NVM) cell. In particular it relates to a NVM that makes use of a single polysilicon layer.

BACKGROUND OF THE INVENTION

FIG. 1 shows a prior art electrically erasable PROM (EEPROM) 100. It includes an n+ drain 102 and n+ source 104 formed in a p-well 106 and separated by a channel region 108. A floating gate 110 is formed over the channel region 108 and separated from the substrate 106 by a dielectric 112 in the form of a gate oxide. A control gate 114, separated from the floating gate 110 by an insulating layer 116, is formed over the floating gate 110. The floating gate 110 acts as the charge storage region for the memory device and is programmed by applying a voltage to the drain 102 and pulsing the control gate 114. This creates a high conductivity region in the channel region 108. High energy electrons (hot electrons) are accelerated across the channel region 108 and occasionally collide with lattice or dopant atoms to generate additional electron-hole pairs by impact ionization. The resultant scattered electrons occasionally have sufficient energy to bridge the gap of the dielectric 112 to the floating gate 110, being helped across by the voltage on the control gate. While programming of the cells involved hot electrons colliding with lattice and dopant atoms, erasing involves Fowler-Nordheim tunneling. In order to achieve this tunneling effect, a high electric field is established across the gate oxide 112 between the floating gate 110 and the channel 108. The effect is that during erasing of the memory cell, electrons are removed from the floating gate 110 by pulsing the drain 102 while holding the control gate 114 at ground or negative potential. The source 104 is permitted to float during erasing. The EEPROM thus has the advantage of allowing individual memory cells to be erased electronically.

FIG. 2 shows an electrically erasable PROM (EEPROM) 200, which differs from the EEPROM in FIG. 1 in that it includes a thin tunnel dielectric 202 between the drain 204 and the floating gate 206. This allows both programming and erasing by Fowler-Nordheim tunneling, which is achieved by providing a potential difference across the drain 204 and control gate 208 of the order of 20V. During programming, electrons are added to the floating gate 206 by holding the drain at ground level and pulsing the control gate 208 at 20V for about 10 ms.

In contrast, during erasing of the memory cell, electrons are removed from the floating gate 206 by pulsing the drain 204 while holding the control gate 208 at ground potential. The source 210 is permitted to float during programming and erasing. As mentioned above, the EEPROM has the advantage of allowing individual memory cells to be erased electronically. In fact, in practice all of the memory cells in an array are typically erased and thereafter select memory cells are programmed.

Yet another type of memory cell, known as the Frohmann-Bentchkowsky EPROM 300, is shown in FIG. 3 and involves only a single poly layer defining a gate 302 separated from a channel region 304 by a gate oxide layer 306. An insulating layer 310 also covers the gate 302 to completely encapsulate the gate 302, thereby defining a floating gate that acts as the charge accumulation region. A p+ drain 312 and p+ source 314 are formed in an n-well 320 or n-substrate on either side of the channel region 304 and programming of the memory cell occurs by providing a lower voltage to the drain 312 compared to the source 314 and well 320. In particular, the well 320 can be held at ground level with the source 314 at ground level, while the drain 312 is held at a negative voltage. Alternatively the drain 312 can be held at ground while the well 320 is provided with a positive voltage and the source 314 is held at the positive voltage. The effect is a high electric field across the channel region 304 which causes hot electrons to be accelerated across the channel and occasionally to generate electron hole pairs by impact ionization. Some of the electrons generated by the impact ionization bridge the gap to the floating gate 302 to establish a negative charge in the gate. However, during the erasing process, since there is no control gate, there is no way to remove the charge from the floating gate. Thus the only way to erase a memory array made of memory cells of this nature is to eradiate them with UV radiation thereby erasing all of the memory cells in the array. Thus while this structure has the advantage of making use of only a single poly layer, it suffers from the disadvantage that individual memory cells in an array cannot be separately erased and the erasing is not electrical.

In order to address this problem, a single poly EEPROM was developed as shown in FIG. 4. This prior art EEPROM includes a first PMOS involving a p+ drain 400 and a p+ source 402 in a first n-well 404 with a floating poly gate 406 formed above a channel 408 between the drain 400 and source 402. The EEPROM further includes a second PMOS comprising a p+ drain 410 and a p+ source 412 in a second n-well 414, with a floating poly 416 formed over a channel region 418 between the drain 410 and p+ source 412. By including a second capacitor as defined by the second poly 416, spaced from the channel region 418 by an oxide layer 420, the cell of FIG. 4 provides for a control gate that allows the storage capacitor (as defined by the poly 406 spaced from the channel 408 by an oxide layer) to be electrically erased. It will however be appreciated that this structure has the drawback that it requires two PMOS devices. It therefore requires a considerable amount of space as defined by the well spacing between the two PMOS devices.

Thus it will be appreciated that each of the prior art devices suffers from certain disadvantages. In the EPROM cell of FIG. 3 the capacitor is defined by a floating gate separated from a well by a gate oxide, however since there is no control gate, the erasing process requires UV radiation. In contrast, all of the electrically erasable memory cells involve a control transistor and a capacitor for charge storage. For instance, in the EEPROM of FIG. 1 and EEPROM of FIG. 2 the capacitor is formed by the floating gate separated by the gate oxide from the well, and a control gate is used to control the floating gate voltage. These EEPROM devices however also suffer from disadvantages, in that the floating gate and control gate are formed from two separate poly layers. In the case of the EEPROM of FIG. 4 the above problem is addressed in that it makes use of only a single poly. However, it requires two n-wells and therefore uses up a lot of space as determined by the well-to-well spacing.

The present invention seeks to improve the memory cell density of the prior art while maintaining the advantage of a single poly structure.

SUMMARY OF THE INVENTION

According to the invention, there is provided an NVM cell comprising a fully isolated substrate, a large poly strip defining a control gate formed on top of the fully isolated substrate and spaced from the fully isolated substrate by a gate oxide, an intermediate-sized poly strip defining a read gate formed on top of the fully isolated substrate and spaced from the fully isolated substrate by a gate oxide, and a small poly strip defining an erase/program gate formed on top of the fully isolated substrate and spaced from the fully isolated substrate by a gate oxide. The read gate may extend over a channel region between two n+ or two p+ regions defining a sense transistor, the two n+ or two p+ regions being formed in a substrate outside the fully isolated substrate. The read gate over the channel region of the transistor may comprise a small poly strip. The two n+ or two p+ regions may define a source region and a drain region of the sense transistor and the substrate in which they are formed may be isolated from the fully isolated substrate. The fully isolated substrate may comprise a substrate region that is isolated along its sides by trench oxide, over its top by a gate oxide, and along its bottom by a buried oxide.

Further according to the invention, there is provided an NVM cell, comprising a floating bulk (FB), a substrate that is isolated from the FB, a drain region and a source region formed in a second substrate, the drain and source regions being separated from each other by a channel over which a first poly strip is formed to define a transistor, a second poly strip formed over the FB defining an erase/programming (E/P) gate, and a third poly strip formed over the FB defining a control gate, wherein a portion of the first poly strip extends over the FB to define a read (R) gate. The control gate is typically larger than the E/P gate and the R gate. The R gate is typically larger than the E/P gate.

The portion of the first poly strip defining the transistor may be smaller than the portion extending over the FB.

Still further, according to the invention, there is provided a method of operating an NVM cell as defined above, comprising programming the NVM cell by providing a high voltage to the control gate and a lower voltage to the programming gate, the potential difference between the control gate and the programming gate being sufficient to cause electrons to pass from the programming gate to the FB by Fowler-Nordheim tunneling. The lower voltage may be ground potential.

The method may further comprise erasing the NVM by applying a high voltage to the programming gate while maintaining the control gate at a lower potential the potential difference between the control gate and the programming gate being sufficient to cause electrons to pass from the FB to the programming gate by Fowler-Nordheim tunneling. Still further, the method may comprise reading the NVM cell by applying a voltage to the drain region and monitoring the drain current of the transistor. The read gate may be connected to the FB or left floating.

DETAILED DESCRIPTION OF THE INVENTION

Figure 1:
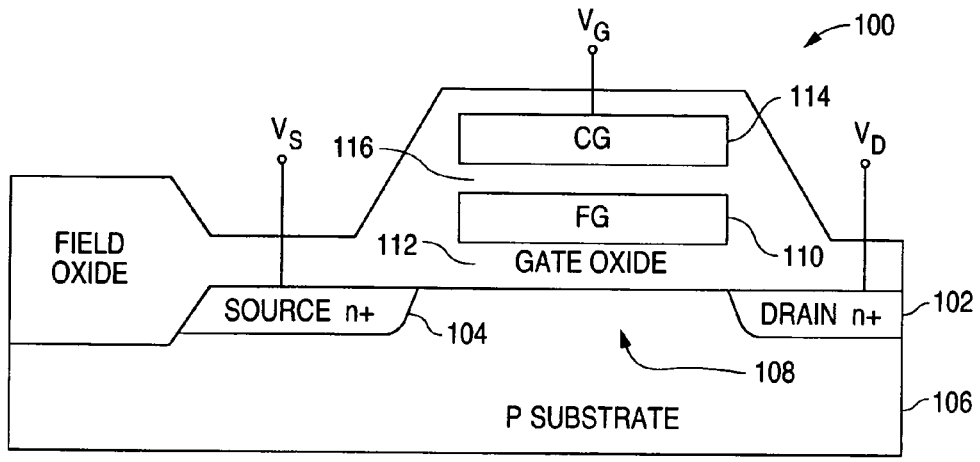
FIG. 1 is a sectional side view of a prior art double poly EEPROM.
Figure 2:
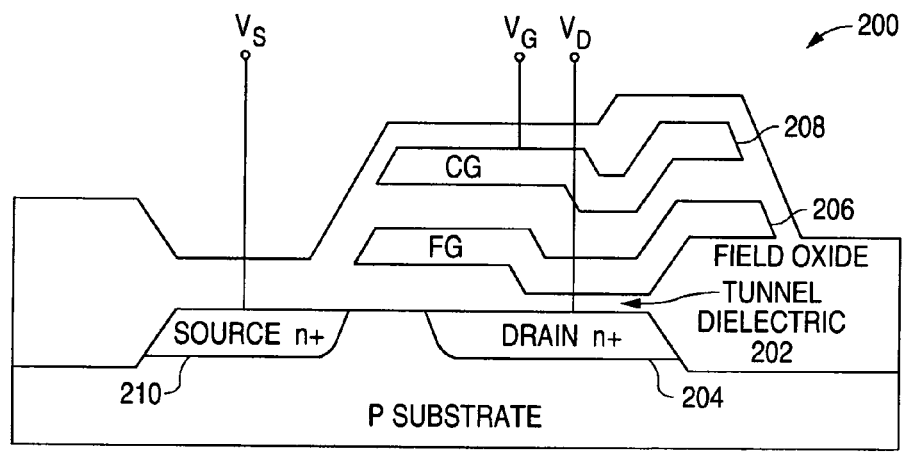
FIG. 2 is a sectional side view of another prior art double poly EEPROM.
Figure 3:
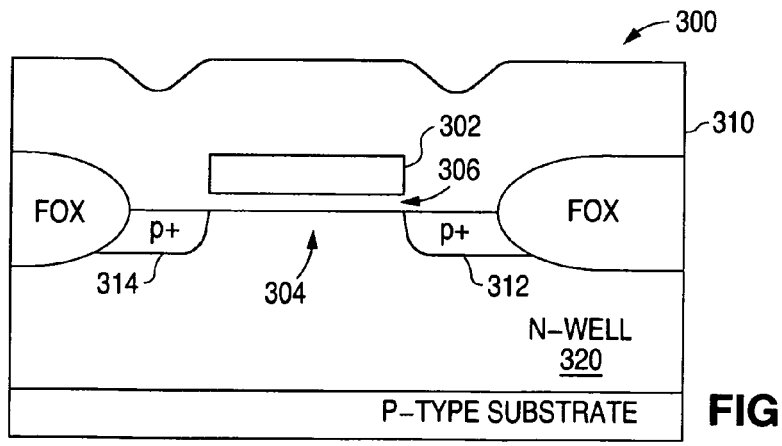
FIG. 3 is a sectional side view of a single poly EPROM memory cell.
Figure 4:
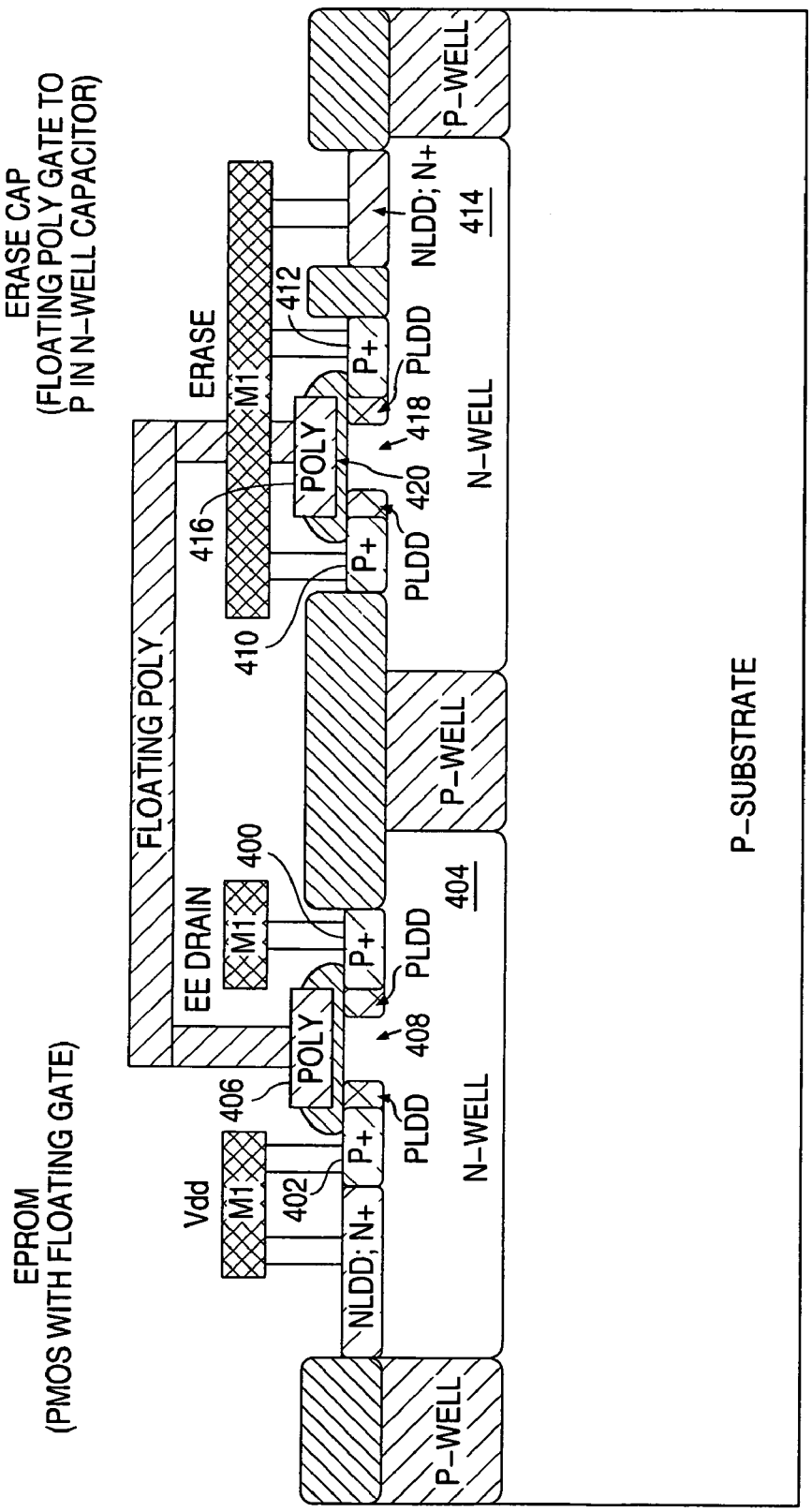
FIG. 4 is a side view of a prior art single poly EEPROM cell.
Figure 5:
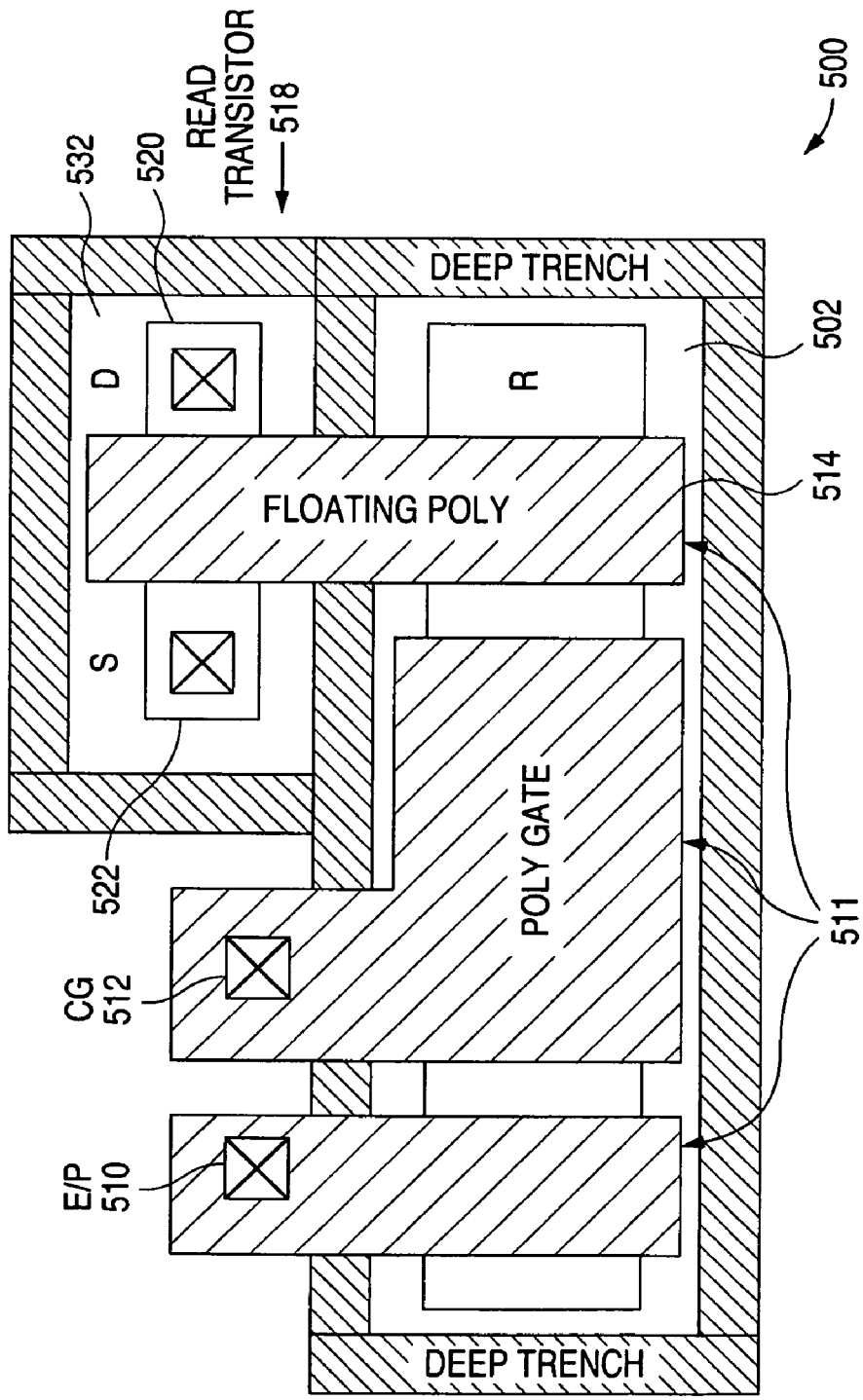
FIG. 5 is a plan view of one embodiment of a single poly NVM cell of the invention.
Figure 6:
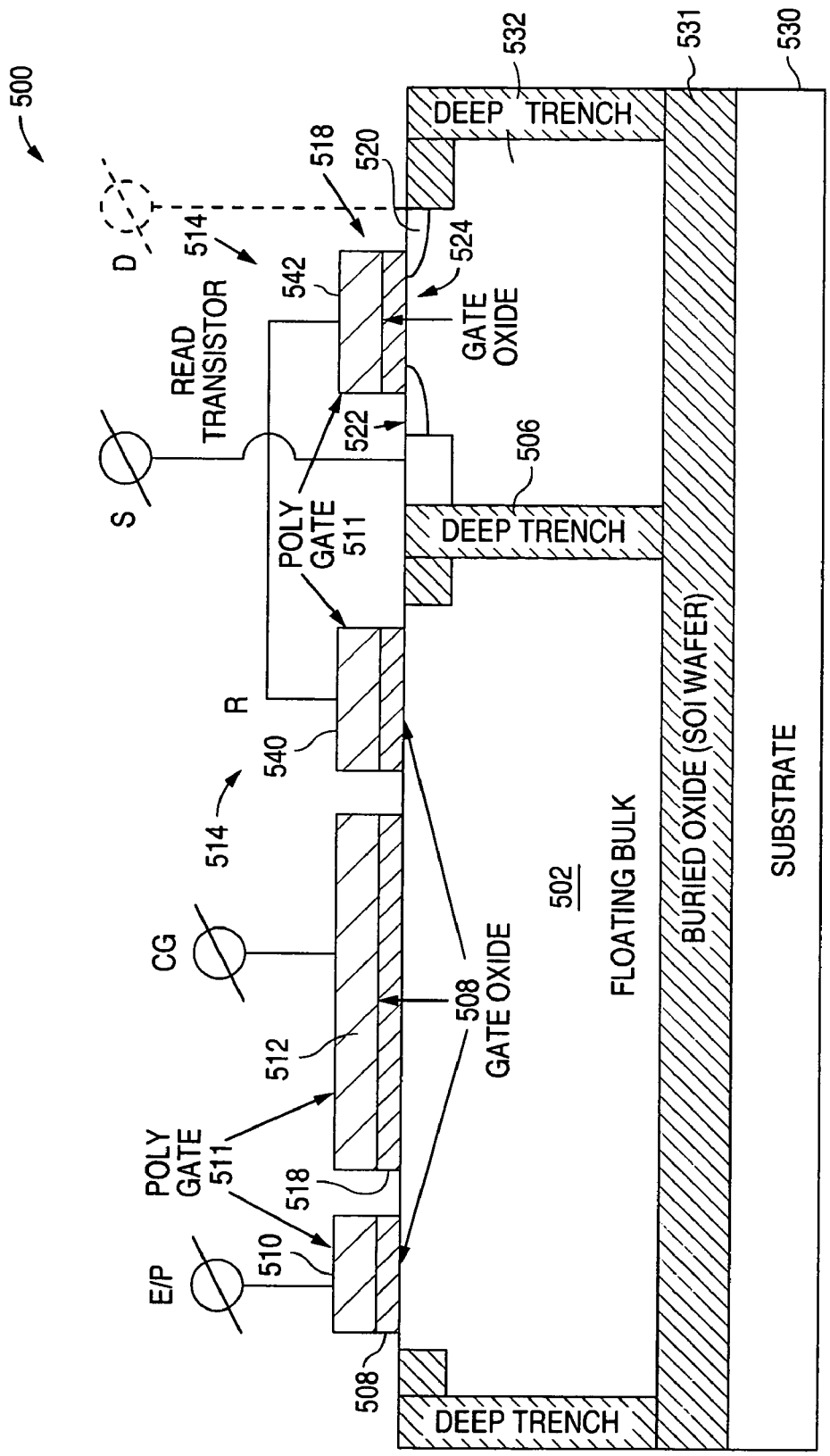
FIG. 6 is a sectional side view of the cell of FIG. 5 but with the read transistor shown laterally arranged to extend in line with the storage portion of the NVM.

One embodiment of the present invention is shown in FIGS. 5 and 6, which show a plan view and an aligned sectional side view, respectively, of one embodiment of a non-volatile memory (NVM) cell in accordance with the invention. As will become clearer from the discussion below, the NVM of the invention makes use of a storage capacitor defined by a fully isolated substrate region and a polysilicon region formed above the fully isolated substrate region and isolated from the fully isolated substrate region by a gate oxide. For purposes of this application the term fully isolated substrate region will be used interchangeably with the term floating bulk (FB).

The NVM 500 of FIGS. 5 and 6 is formed as part of a Silicon over Isolator (SOI) process in which a portion of the substrate 502 is isolated by a buried oxide 504. In accordance with the invention the substrate 502 is fully isolated from the substrate 530 below by buried oxide 531 (shown in FIG. 6) and the substrate region 532 extending perpendicularly to the substrate 502 (shown in FIG. 5). It will be appreciated that the side view shown in FIG. 6 is, for convenience, represented as being linear in which the substrate region 532 is aligned with the fully isolated substrate 502. The isolated substrate is laterally isolated by a deep trench oxide 506 along the sides, and over the top by a gate oxide 508. Instead of a deep trench oxide 506 a shallow trench oxide could be used to isolate the substrate 502. Since the substrate 502 is fully isolated it is also referred to as a floating bulk (FB) in this application.

The NVM cell 500 includes a storage capacitor defined by a polysilicon (poly) strip 510 formed as part of a single poly layer 511. The poly layer 511 is formed on top of the gate oxide 508 thereby spacing it from the fully isolated substrate 502. Thus by providing a potential difference across the poly strip 510 (which defines the erase/program gate (E/P G)) and the floating bulk (FB) 502 electrons can be caused to move to or from the FB by Fowler-Nordheim tunneling as is described in greater detail below. As is discussed in greater detail below, the creation of the potential difference over the E/P G and FB includes controlling the voltage of the FB by capacitive coupling.

In addition to the E/P G, the NVM cell 500 also includes a poly strip 512 formed from the layer 511, which acts as a control gate (CG) and controls the potential of the FB by electrically coupling with the FB 502.

The NVM cell 500 further includes a read transistor 518 defined by a p+ drain region 520 and p+ source region 522 separated from each other by a channel 524. The p+ drain 520 and p+ source 522 are both formed in a substrate 532, which is isolated from the FB 502 as discussed above.

As shown in FIGS. 5 and 6 a poly strip 514 is formed from the poly layer 511 to define a read (R) gate 540 for the NVM cell as well as provide an extension to a channel region between a drain region 520 and source region 522 to form a transistor gate 542 of a sense transistor. Since the transistor gate simply forms an extension of the R gate 540 (shown in FIG. 6 as an electrical connection) any voltage change on the R gate 540 will appear as a voltage change on the transistor gate 542 thereby allowing the voltage on the R gate 540 to be monitored as is discussed in greater detail below.

As shown in FIGS. 5 and 6 the poly strip of the CG 512 is larger than the poly strips 510, 514. This allows it to provide for good coupling with the FB 502. Thus voltage changes to the control gate 512 are transferred to the FB 502 and serve to erase or program the FB 502 depending on the relative voltage of the E/P G. The poly strip 514 is in turn larger than the poly strip 510 to provide for better coupling with the FB for sensing by the sensing transistor through the transistor gate 542. In this embodiment the portion of the poly strip 514 forming the transistor gate 542 is substantially the same size as the portion over the FB defining the R gate. In another embodiment the portion over the channel 524, forming the transistor gate 542 is smaller than the portion over the FB and is formed to be substantially the same size as the poly strip 510. The R gate 540 in this embodiment is left floating so that the voltage on the R gate depends on the coupling ratio between FB and R gate, however in another embodiment the R gate is connected to the FB so that the voltage on the R gate is the same as that of the FB.

During the programming of the memory cell a positive voltage of about 10 V (depending on the gate oxide 508 thickness) is applied to the CG 512. All other nodes are grounded. Thus the electrical coupling between the CG 512 and the FB 502 provides a high voltage on the FB 502 sufficient to allow electrons to tunnel from the E/P G 510 to the FB 502 by Fowler-Nordheim (F-N) tunneling. This makes the potential of the FB 502 more negative.

In contrast, during erasing of the memory cell a positive voltage of about 10 V (again depending on the gate oxide 508 thickness) is applied to the E/P G 510, while all other nodes are grounded. Due to coupling between the control gate (CG) 512 and the FB 502, this results in a low voltage on the FB 502. As a result of F-N tunneling electrons tunnel from the FB 502 to the E/P G, leaving the FB potential more positive. During reading of the NVM cell 500 a read voltage of 1-3 V is applied to the drain 520 and the drain current is monitored. The FB can either be connected to the R gate thereby ensuring that the R gate 524 tracks the FB voltage, or the R gate can be left floating, in which case the voltage on the R gate remains a function of the FB voltage depending on the coupling ratio of the upper capacitor plate as defined by the poly strip 540 and the lower capacitor plate as defined by the floating bulk 502. Since the drain current depends on the voltage on the R gate, it is possible to determine the voltage on the FB and thus the amount of positive or negative charge on the FB 502.

While the above embodiment made use of a PMOS transistor 518 the NVM cell of the invention can instead be implemented using an NMOS transistor.

The benefit of the present invention is that it provides a smaller size NVM cell. Instead of the size being defined by the well size as in prior art NVM cells that use only a single poly, the NVM cell size in the present invention is defined by the poly-to-poly space which can be significantly smaller.

The NVM cell of the invention also has the advantage of decoupling the E/P gate poly 510 from the read transistor which is expected to improve data retention under bias conditions.

What is claimed is:

1. An NVM cell, comprising
a fully isolated substrate,
a drain region and a source region formed in a substrate material that is isolated from the fully isolated substrate, and
three polysilicon strips formed on top of the fully isolated substrate, one of the polysilicon strips extending across to the substrate that is isolated from the fully isolated substrate, wherein the three poly strips formed on top of the fully isolated substrate define a small gate for erasing and programming (E/P), a large control gate (CG) and an intermediately sized read gate (R).

2. An NVM cell of claim 1, wherein the polysilicon strip extending across to the substrate that is isolated from the fully isolated substrate is a portion of the read gate, which extends over a channel region between the drain and source regions, thereby defining a polygate of a MOS transistor.

3. An NVM of claim 1, wherein the drain and source regions define a MOS transistor, which includes a poly gate that is connected to the read gate.

4. An NVM cell of claim 3, wherein the portion of the read gate over the fully isolated substrate is larger than the portion of the read gate over the channel of the transistor.

5. An NVM cell comprising
a fully isolated substrate,
a large poly strip defining a control gate formed on top of the fully isolated substrate and spaced from the fully isolated substrate by a gate oxide,
an intermediate-sized poly strip defining a read gate formed on top of the fully isolated substrate and spaced from the fully isolated substrate by a gate oxide, and
a small poly strip defining an erase/program gate formed on top of the fully isolated substrate and spaced from the fully isolated substrate by a gate oxide, wherein a portion of the read gate extends outside the fully isolated substrate, and each of the poly strips is a discrete strip that is separate from the other strips.

6. An NVM cell of claim 5, wherein a portion of the read gate extends over a channel region between two n+ or two p+ regions defining a sense transistor, the two n+ or two p+ regions being formed in a substrate outside the fully isolated substrate.

7. An NVM cell of claim 6, wherein the portion of the read gate over the channel region of the transistor is of similar size to the erase/program gate.

8. An NVM cell of claim 6, wherein the two n+ or two p+ regions define a source region and a drain region of the sense transistor and the substrate in which they are formed is isolated from the fully isolated substrate.

9. An NVM cell of claim 8, wherein the fully isolated substrate comprises a substrate region that is isolated along its sides by trench oxide, over its top by a gate oxide, and along its bottom by a buried oxide.

* * * * *

UNITED STATES PATENT AND TRADEMARK OFFICE
CERTIFICATE OF CORRECTION

| | | |
|---|---|---|
| PATENT NO. | : 7,808,034 B1 | Page 1 of 1 |
| APPLICATION NO. | : 11/652783 | |
| DATED | : October 5, 2010 | |
| INVENTOR(S) | : Jeff Babcock et al. | |

It is certified that error appears in the above-identified patent and that said Letters Patent is hereby corrected as shown below:

On the Title Page:
Item (75) Inventors: Remove "Natasha Layrovskava" and insert -- Natasha Lavrovskaya --.

Signed and Sealed this

Fifteenth Day of February, 2011

David J. Kappos
*Director of the United States Patent and Trademark Office*